United States Patent
Ma et al.

(10) Patent No.: US 6,812,810 B2
(45) Date of Patent: Nov. 2, 2004

(54) BRIDGES FOR MICROELECTROMECHANICAL STRUCTURES

(75) Inventors: Qing Ma, San Jose, CA (US); Tsung-Kuan Allen Chou, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 86 days.

(21) Appl. No.: 10/174,935

(22) Filed: Jun. 19, 2002

(65) Prior Publication Data

US 2003/0234703 A1 Dec. 25, 2003

(51) Int. Cl.[7] .................................................. H01P 5/12
(52) U.S. Cl. ..................... 333/126; 333/1; 333/105; 333/262
(58) Field of Search ............................ 333/1, 105, 262, 333/126

(56) References Cited

U.S. PATENT DOCUMENTS

| | | | |
|---|---|---|---|
| 3,539,705 A | | 11/1970 | Nathanson et al. |
| 4,670,297 A | | 6/1987 | Lee et al. |
| 4,739,519 A | * | 4/1988 | Findley ...................... 455/327 |
| 4,920,323 A | | 4/1990 | Schloemann et al. |
| 5,148,260 A | | 9/1992 | Inoue et al. |
| 5,194,833 A | * | 3/1993 | Dougherty et al. ........... 333/33 |
| 5,281,769 A | | 1/1994 | Hirano et al. |
| 5,408,742 A | | 4/1995 | Zaidel et al. |
| 5,817,446 A | | 10/1998 | Lammert |
| 6,296,988 B1 | * | 10/2001 | Lee ............................. 430/318 |
| 6,458,516 B1 | * | 10/2002 | Ye et al. ..................... 430/317 |
| 6,692,979 B2 | * | 2/2004 | Yeh et al. ..................... 438/27 |

FOREIGN PATENT DOCUMENTS

| | | |
|---|---|---|
| EP | 0 309 805 B1 | 12/1993 |
| EP | 0 703 614 A2 | 3/1996 |
| WO | WO 03/019657 A2 | 3/2003 |

\* cited by examiner

*Primary Examiner*—Benny Lee
*Assistant Examiner*—Kimberly Glenn
(74) *Attorney, Agent, or Firm*—Trop, Pruner & Hu, P.C.

(57) ABSTRACT

A conductive bridge in a second conductive layer may be utilized to join a pair of spaced apart conductive strips in a first conductive layer. A gap between the first and second strips may be bridged by the bridge while isolating both the first and second strips and the bridge itself from another conductor which extends through the gap between the first and second strips.

27 Claims, 7 Drawing Sheets

BRIDGES FOR MICROELECTROMECHANICAL STRUCTURES

BACKGROUND

This invention relates generally to microelectromechanical structures (MEMS).

Microelectromechanical structures are physical structures which may be fabricated using microelectronic fabrication techniques. In the fabrication of MEMS devices, it is often desirable to isolate different structures electrically from one another. To this end, an air gap may be positioned underneath an electrical connector. Such a structure may be called a bridge since it allows an electrical connection over an air gap and provides for isolation from underlying devices.

For example, for multi-mode multi-band cell phone applications, an antenna switch multiplexer switches the antenna to a different mode or band, as well as between transmission and receiving. The multiplexer consists of many individual switches. To route the signal lines, ground lines, and actuation control lines across each other, more that two metal layers are needed.

For example, an in-line cantilever beam metal contact series switch generally requires two metal lines in order to allow the connection. A first signal line may be in a first layer, a second signal line may also be in the first layer, an actuation element may be in the first layer, but the cantilever beam metal contact switch itself must be in at least a second layer.

Thus, there is a need for better ways to allow connections in MEMS devices.

DETAILED DESCRIPTION

Figure 1:
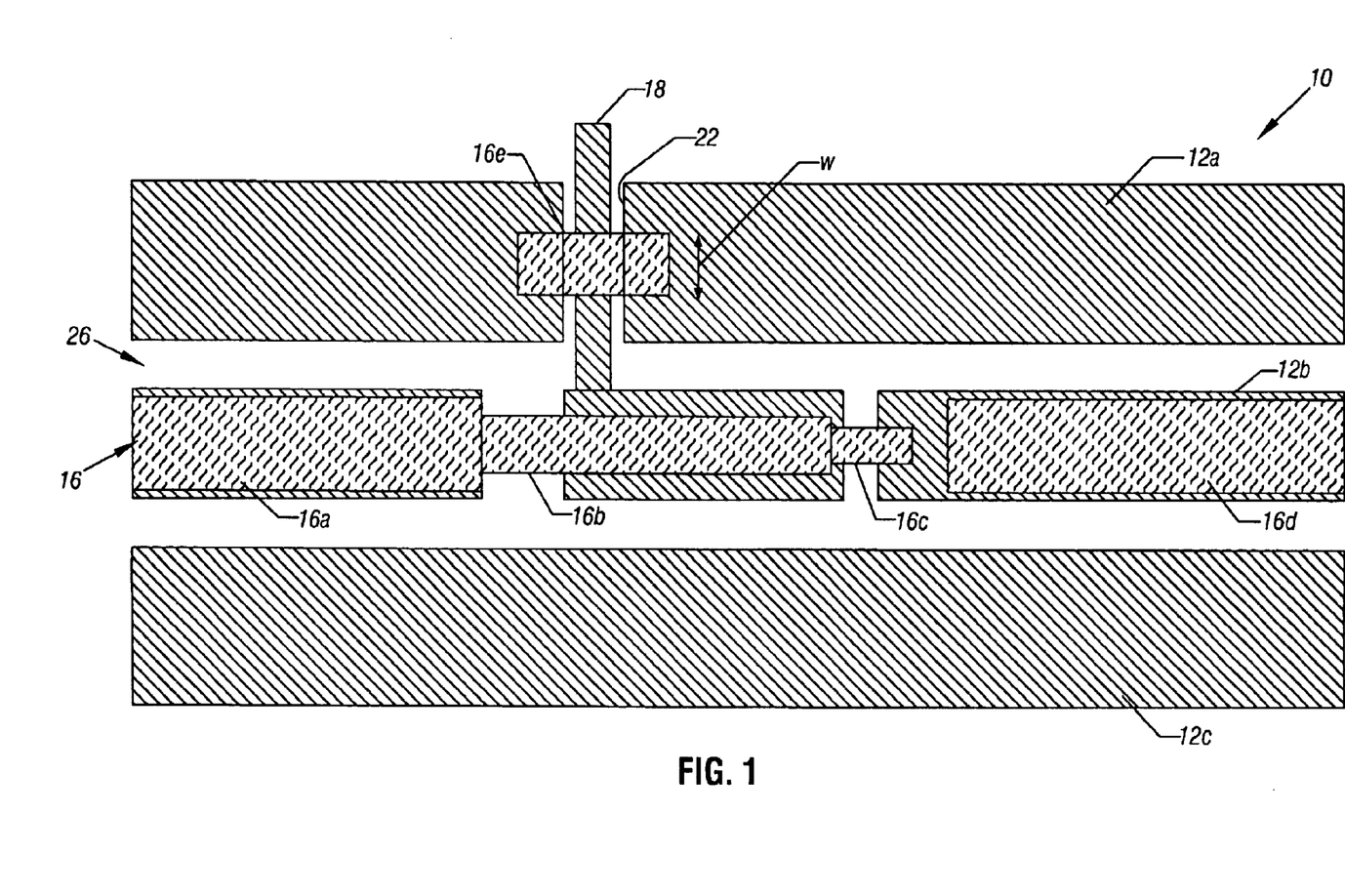
FIG. 1 is a top plan view of one embodiment of the present invention.

Referring to FIG. 1, a basic switch/transmission line co-planar waveguide (CPW) 10 includes a control voltage line 18 that is routed under a bridge 16e across a ground line 12a, including two strips separated by a gap 22, in accordance with one embodiment of the present invention. The ground lines 12a, 12b, and 12c may be formed in a first conductive layer. The signal line 16 may be made in a second, separate conductive layer. The control voltage line 18 may also be in the first conductive layer.

The width of the CPW 10 generally scales with the width of the signal line 16. The width of the signal line 16 may be reduced by using both of the first and second conductive layers in order to have the necessary conductivity. Thus, the ground lines 12 may be made using a thin bottom metal layer in one embodiment.

The width "W" of the bridge 16e may be small enough so that a sacrificial layer (not shown in FIG. 1) underneath the bridge 16e may be removed during a release step. In one embodiment, the span of the bridge 16e may be smaller than approximately five times the thickness of the second, upper conductive layer so that the bridge 16e is stiff enough not to collapse under voltage between the two conductive layers.

Figure 2:
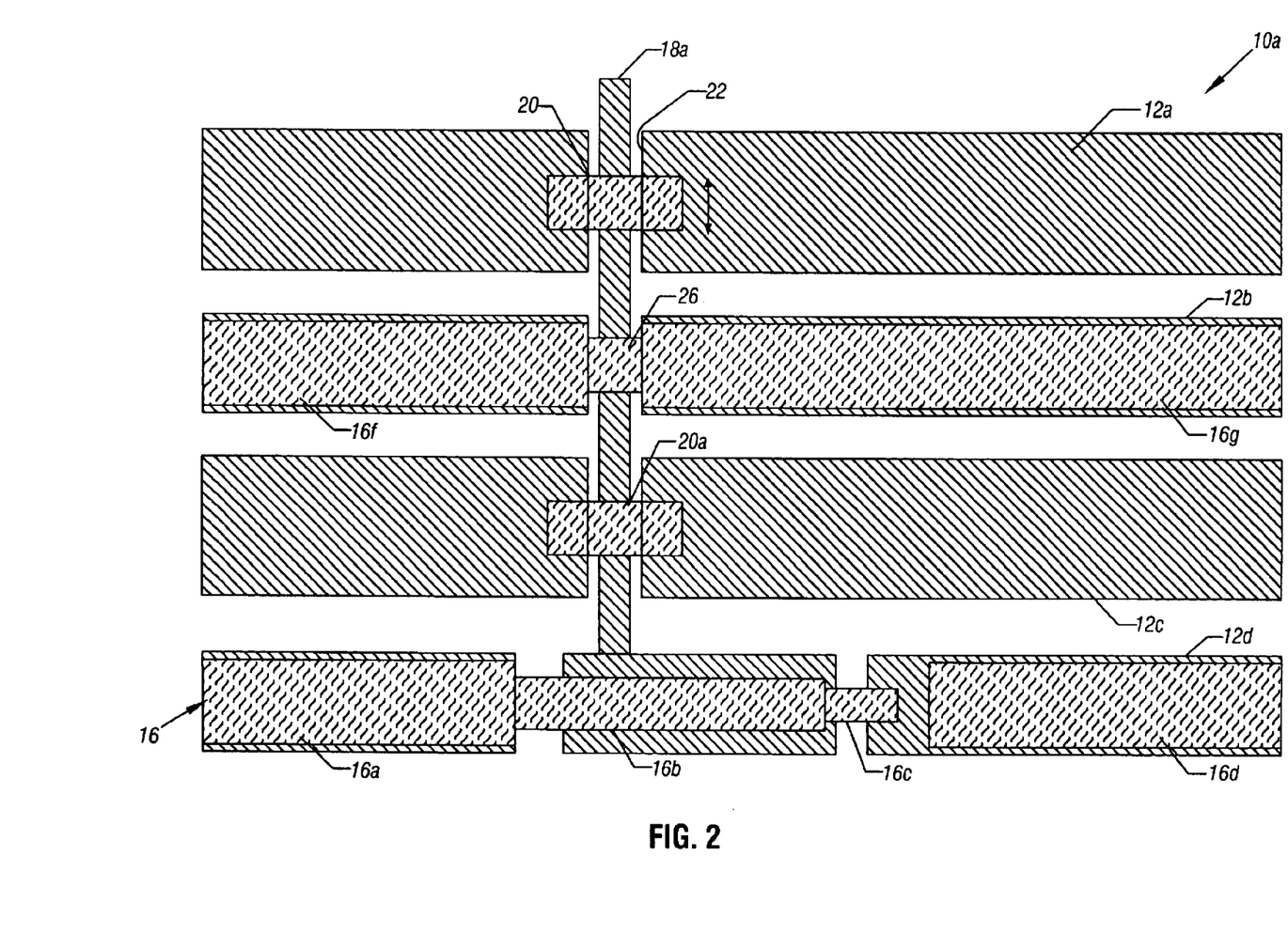
FIG. 2 is a top plan view of a second embodiment of the present invention.

FIG. 2 shows a multiplexer 10a which includes ground lines 12, signal lines 16f and 16g, as well as the signal lines 16a through 16g in accordance with another embodiment of the present invention. The bridge 20a bridges the ground lines 12c, the bridge 26 bridges the elements 16f and 16g, and the bridge 20 bridges the ground lines 12a. Thus, the control voltage line 18a may span all the way through three separate ground lines, 12a, 12b, and 12c, to reach the ground line 12d.

Figure 3:
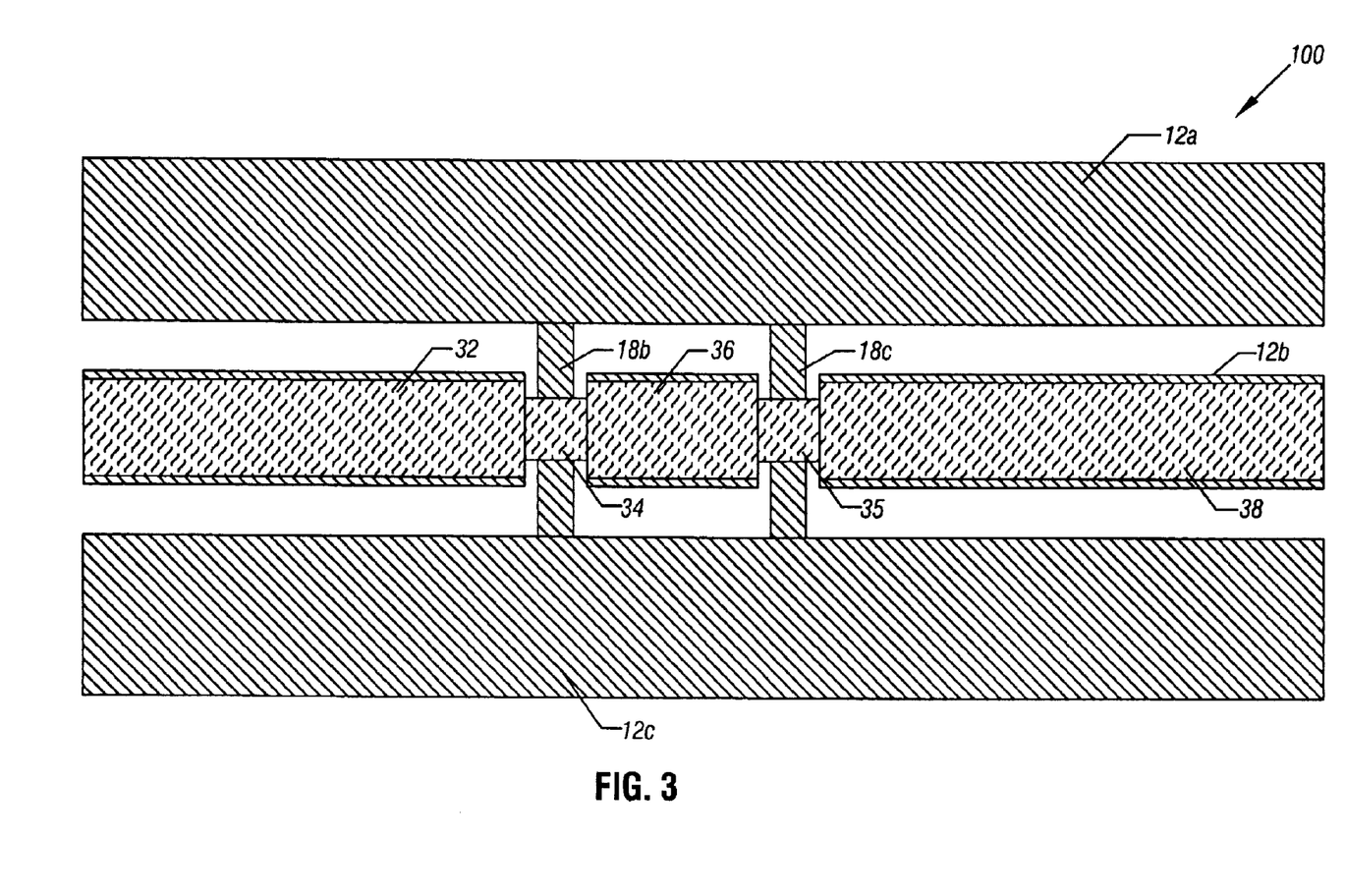
FIG. 3 is a top plan view of a third embodiment of the present invention.

Referring to FIG. 3, in accordance with still another embodiment of the present invention, the ground lines 12a, 12b, and 12c may be crossed by control lines 18b and 18c. The control voltage line 18b goes under a bridge 34 and the control voltage line 18c goes under a bridge 35. The signal lines 32 and 36 are joined by the bridge 34. The signal lines 36 and 38 are joined by the bridge 35. By keeping the span of each bridge 34 and 35 relatively small, multiple bridges may be needed in some embodiments. Thus, the intermediate signal line portion 36 may provide an island which allows the length of the bridges 34 and 35 to be limited to the desired length.

Figure 4:
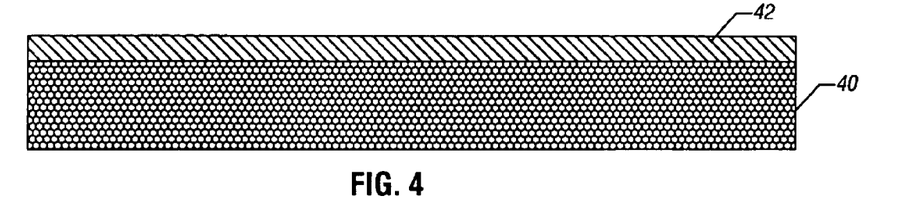
FIG. 4 is an enlarged cross-sectional view of a technique in accordance with one embodiment of the present invention.

In accordance with one embodiment of the present invention, a bridge, such as a bridge 16e, 16c, 20, 26, 20a, 16c, 34, or 35, may be formed by forming a dielectric layer 42 over a semiconductor substrate 40. The dielectric layer may be silicon dioxide or silicon nitride, as two examples.

Figure 5:
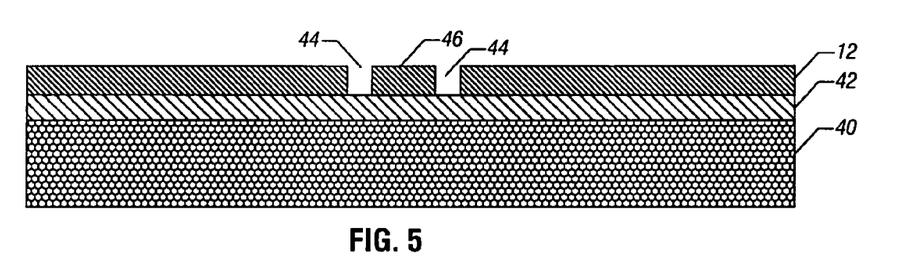
FIG. 5 is an enlarged cross-sectional view of the embodiment shown in FIG. 4 at a subsequent stage in accordance with one embodiment of the present invention.

Then, as shown in FIG. 5, a first or bottom conductive layer 12 may be deposited on the dielectric layer 42 and patterned. The patterning of the layer 12 forms the central island 46 and the gaps 44. The bottom conductive layer 12 may be a composite of titanium, nickel, and gold, in one embodiment.

Figure 6:
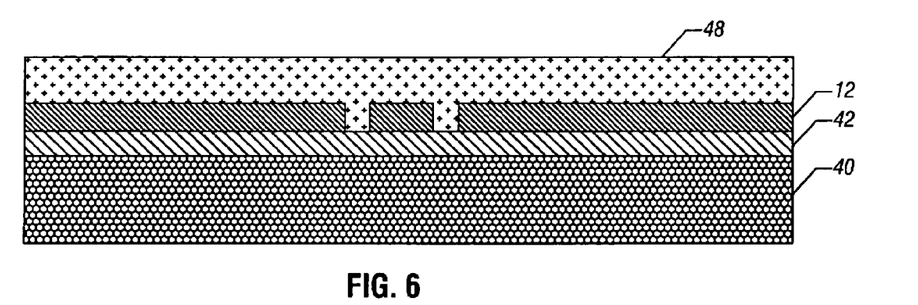
FIG. 6 is an enlarged cross-sectional view at a subsequent stage in accordance with one embodiment of the present invention.

Referring to FIG. 6, the structure may then be covered with a sacrificial layer 48. The sacrificial layer 48 may be deposited or spun-on in some embodiments. In one embodiment, the sacrificial layer 48 may be made of polymeric materials, such as polyimide, resist, or flowable glasses, that reflow, shrink, melt, or vaporize at elevated temperatures.

Figure 7:
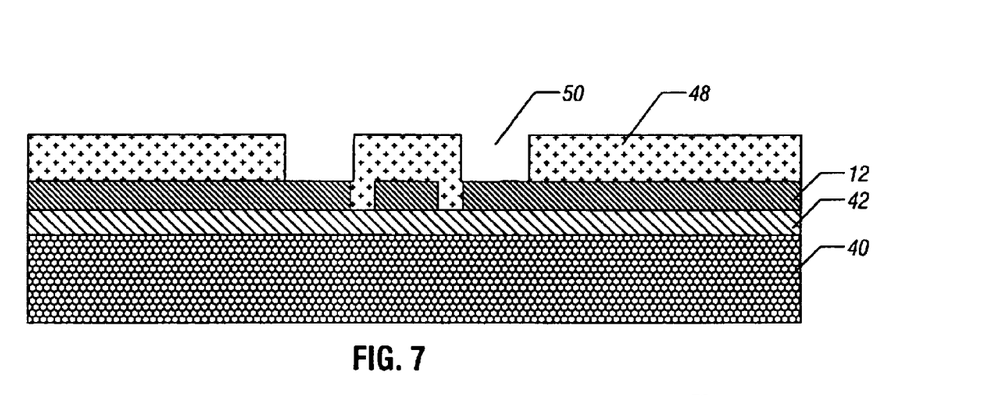
FIG. 7 is an enlarged cross-sectional view at a subsequent stage in accordance with one embodiment of the present invention.

Next, referring to FIG. 7, after lithography and etching, anchor holes 50 may be formed in the sacrificial layer 48.

Figure 8:
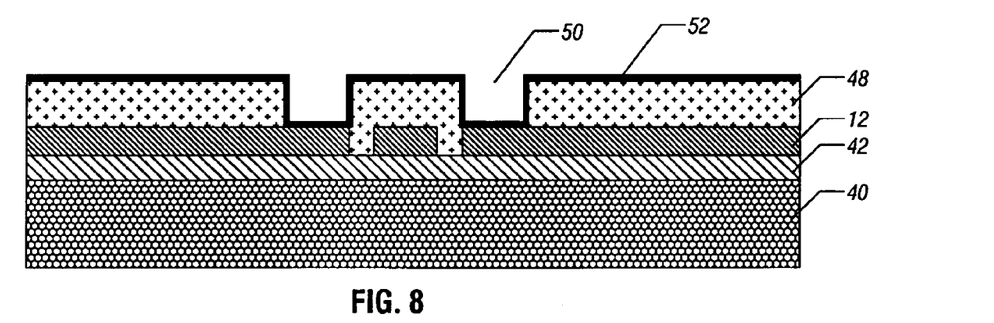
FIG. 8 is an enlarged cross-sectional view at a subsequent stage in accordance with one embodiment of the present invention.
Figure 9:
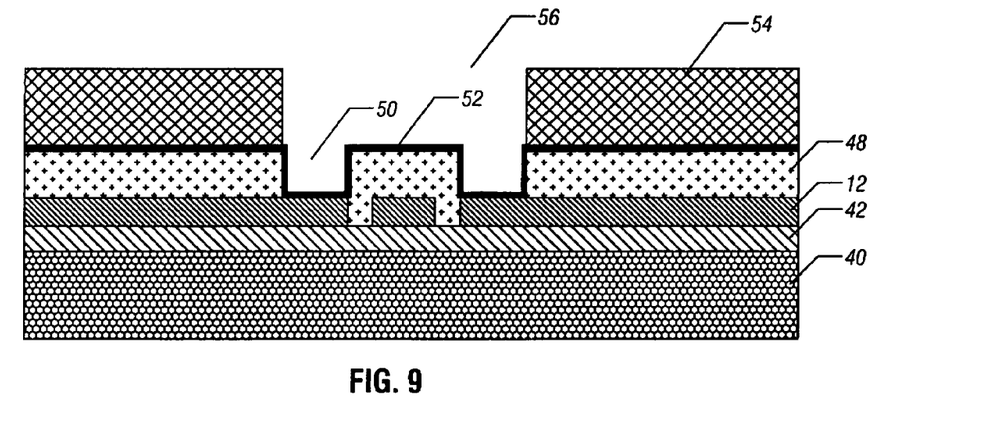
FIG. 9 is an enlarged cross-sectional view of a subsequent stage in accordance with one embodiment of the present invention.

A seed layer 52, for facilitating plating, may then be coated over the structure shown in FIG. 7 to achieve the structure shown in FIG. 8. A thick resist 54 may be patterned as a mold for plating as shown in FIG. 9. Next, a bridge 16 may be plated, using the seed layer 52 to facilitate adherence of the bridge 16, and using the resist 54 as a mold for defining the bridge 16. The second or top conductive layer forming the bridge 16 may be gold in one embodiment of the present invention.

Figure 10:
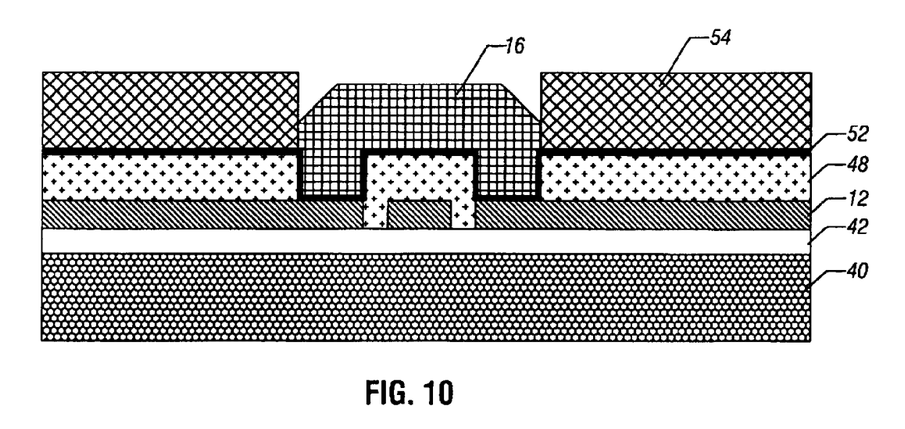
FIG. 10 is an enlarged cross-sectional view of a subsequent stage in accordance with one embodiment of the present invention.
Figure 11:
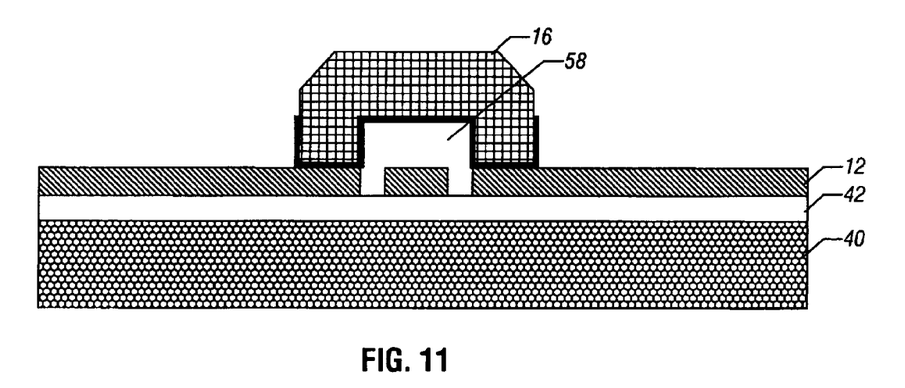
FIG. 11 is an enlarged cross-sectional view of a subsequent stage in accordance with one embodiment of the present invention.

After plating the bridge 16, the resist 54 may be removed. The seed layer 52 may be etched away and the material 48 may be released, forming a void 58 under the bridge 16. In one embodiment, the sacrificial material 48 is released through the application of heat.

Figure 12:
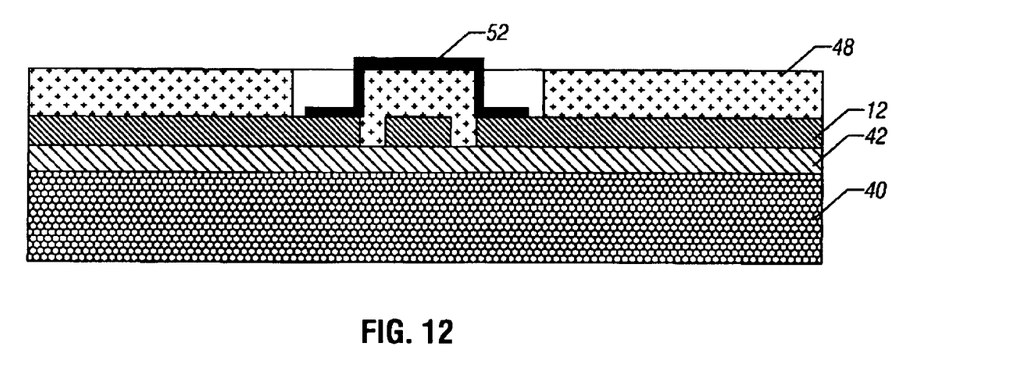
FIG. 12 is an enlarged cross-sectional view of a stage subsequent to the stage depicted in FIG. 8 in accordance with another embodiment of the present invention.
Figure 13:
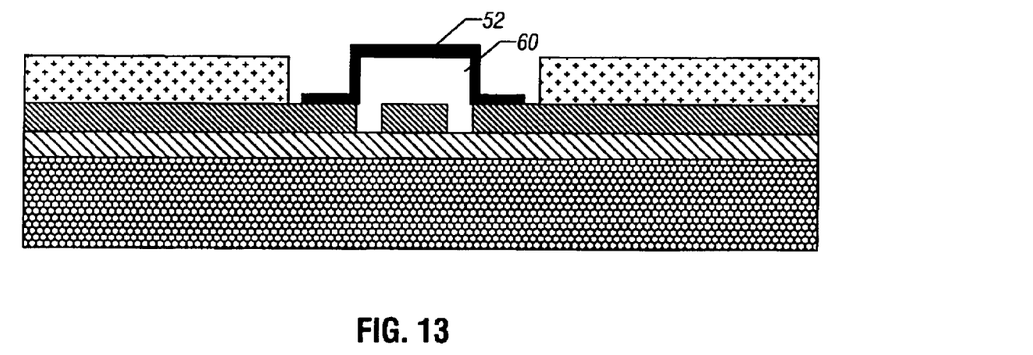
FIG. 13 is an enlarged cross-sectional view of a subsequent stage to that shown in FIG. 12 in accordance with one embodiment of the present invention.

In another embodiment of the present invention, after the structure shown in FIG. 8 is formed, etching may be used to form the U-shaped metal structure 52, as shown in FIG. 12. Instead of plating a seed layer, a heavier metal layer 52 may be formed in this embodiment. Thereafter, the air bridge may be formed by releasing the material 48, forming the void 60.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming a pair of conductive strips in a first conductive layer, said strips separated by a gap;
   extending a conductor through said gap in the fist conductive layer; and
   forming, in a second conductive layer, a conductive bridge that electrically isolates said first and second strips from said conductor and forming said bridge with a span less than approximately 5 times the thickness of said second conductive layer.

2. The method of claim 1 including forming a co-planar waveguide.

3. The method of claim 1 including forming a multiplexer.

4. The method of claim 1 including forming said second conductive layer over said first conductive layer.

5. The method of claim 4 including forming a release material under said conductive bridge and releasing said release material.

6. The method of claim 5 including releasing said release material by applying heat.

7. The method of claim 1 including enabling a control voltage line to extend through a plurality of ground lines formed by the same first conductive layer by providing gaps for said control voltage line to extend through said ground lines.

8. The method of claim 7 including forming a plurality of bridges to connect each ground line across each of said gaps.

9. The method of claim 1 including depositing an insulator on a semiconductor structure, forming a release material on said insulator, and forming a seed layer on said release layer.

10. The method of claim 9 including forming a mold layer over said seed layer to define the shape of said bridge.

11. An integrated circuit comprising:
    a semiconductor structure;
    a first conductive layer formed on said semiconductor structure, said first conductive layer including a pair of conductive strips separated by a gap, said first conductive layer further including a line extending across said gap in isolation from said strips, said line being a control voltage line that extends completely through a plurality of ground lines, said ground lines including a gap allowing the passage of said control line; and
    a second conductive layer over said first conductive layer, said second conductive layer including a plurality of bridges that connect said ground lines across the gaps over said control line voltage.

12. The circuit of claim 11 wherein said circuit includes a co-planar waveguide.

13. The circuit of claim 11 wherein said circuit includes a multiplexer.

14. The circuit of claim 11 wherein said bridge has a span less than approximately five times the thickness of said second conductive layer.

15. A method comprising:
    forming a first conductive layer including a pair of conductive strips separated by a gap and a conductive line extending through said gap between said strips;
    forming a second conductive layer including a bridge that electrically couples said first and second strips in isolation from said conductive line;
    depositing an insulator on a semiconductor structure;
    forming a release layer on said insulator, and
    forming said bridge over said release layer that is removed in response to the application of heat.

16. The method of claim 15 including forming a co-planar waveguide.

17. The method of claim 15 including forming a multiplexer.

18. The method of claim 15 including forming said second conductive layer over said first conductive layer.

19. The method of claim 18 including forming said bridge with a span less than approximately five times the thickness of said second conductive layer.

20. The method of claim 15 including enabling a control voltage line to extend through a plurality of ground lines formed in said first conductive layer by providing gaps for said control voltage line to extend through said ground lines.

21. The method of claim 20 including forming a plurality of bridges to couple each ground line across each of said gaps.

22. The method of claim 15 including depositing an insulator on a semiconductor structure, forming a release layer on said insulator, and forming a seed layer on said release layer.

23. The method of claim 22 including forming a mold layer over said seed layer to define the shape of said bridge.

24. An integrated circuit structure comprising:
    a semiconductor structure;
    a first conductive layer formed on said semiconductor structure, said conductive layer including a pair of conductive strips separated by a gap, said first conductive layer further including a line extending through said gap in isolation from said strips;
    a conductive seed layer over said first conductive layer:
    a second conductive layer over said first conductive layer and said seed layer, said second conductive layer including a bridge which couples said first strip to said second strip in electrical isolation from said line; and a release material between said bridge and said line, said release material being removable in response to the application of heat.

25. The structure of claim 24 wherein said bridge has a span of less than approximately five times the thickness of said second conductive layer.

26. The structure of claim 24 wherein said line is a control voltage line that extends completely through a plurality of ground lines, each of said ground line including a gap along the passage of said control line, said structure including a plurality of bridges that connect to each of said ground lines across said gaps over said control voltage line.

27. The structure of claim 24 wherein said release material is polymeric.

* * * * *

UNITED STATES PATENT AND TRADEMARK OFFICE
CERTIFICATE OF CORRECTION

PATENT NO. : 6,812,810 B2
DATED : November 2, 2004
INVENTOR(S) : Qing Ma and Tsung-Kuan Allen Chou It is certified that error appears in the above-identified patent and that said Letters Patent is hereby corrected as shown below:

Column 6,
Line 1, "line" should be -- lines --.

Signed and Sealed this

Fifth Day of April, 2005

JON W. DUDAS
*Director of the United States Patent and Trademark Office*